United States Patent
Mihnea et al.

(10) Patent No.: US 7,085,170 B2
(45) Date of Patent: *Aug. 1, 2006

(54) METHOD FOR ERASING AN NROM CELL

(75) Inventors: Andrei Mihnea, Boise, ID (US); Chun Chen, Boise, ID (US)

(73) Assignee: Micron Technology, Ind., Boise, ID (US)

( * ) Notice: Subject to any disclaimer, the term of this patent is extended or adjusted under 35 U.S.C. 154(b) by 152 days.

This patent is subject to a terminal disclaimer.

(21) Appl. No.: 10/636,181

(22) Filed: Aug. 7, 2003

(65) Prior Publication Data

US 2005/0030794 A1    Feb. 10, 2005

(51) Int. Cl.
G11C 16/04    (2006.01)
G11C 16/06    (2006.01)

(52) U.S. Cl. .............................. 365/185.3; 365/185.18; 365/185.19; 365/185.22; 365/185.24; 365/185.29

(58) Field of Classification Search ............. 365/185.3, 365/185.28, 185.19, 185.22, 185.29, 185.18, 365/185.24

See application file for complete search history.

(56) References Cited

U.S. PATENT DOCUMENTS

| 4,184,207 A | 1/1980 | McElroy |
| 4,420,504 A | 12/1983 | Cooper |
| 4,755,864 A | 7/1988 | Ariizumi |
| 4,881,114 A | 11/1989 | Mohsen |
| 5,241,496 A | 8/1993 | Lowrey |
| 5,330,930 A | 7/1994 | Chi |
| 5,378,647 A | 1/1995 | Hong |
| 5,379,253 A | 1/1995 | Bergemont |
| 5,397,725 A | 3/1995 | Wolstenholme |
| 5,467,305 A | 11/1995 | Bertin |
| 5,576,236 A | 11/1996 | Chang |
| 5,576,992 A * | 11/1996 | Mehrad ................. 365/185.24 |
| 5,768,192 A | 6/1998 | Eitan |
| 5,792,697 A | 8/1998 | Wen |
| 5,858,841 A | 1/1999 | Hsu |
| 5,909,392 A * | 6/1999 | Chang et al. .......... 365/185.12 |
| 5,911,106 A | 6/1999 | Tasaka |
| 5,946,558 A | 8/1999 | Hsu |

(Continued)

FOREIGN PATENT DOCUMENTS

EP    84303740.9    1/1985

(Continued)

OTHER PUBLICATIONS

B. Eitan et al., "Characterization of Channel Hot Electron Injection by the Subthreshold Slope of NROM™ Device," IEEE Electron Device Lett., vol. 22, No. 11, (Nov. 2001) pp. 556-558, Copyright 2001 IEEE.

(Continued)

Primary Examiner—Amir Zarabian
Assistant Examiner—Ly Duy Pham
(74) Attorney, Agent, or Firm—Leffert Jay & Polglaze, P.A.

(57) ABSTRACT

An operation to erase a nitride read only memory (NROM) memory block starts by erasing the memory block. An erase verify operation can then be performed to determine the success of the erase. If a read operation is performed and column current is detected, a high-efficiency recovery operation is performed. If the read operation is performed and column current is not detected, the erase operation has been successfully completed.

11 Claims, 4 Drawing Sheets

U.S. PATENT DOCUMENTS

| | | | |
|---|---|---|---|
| 5,966,603 A | 10/1999 | Eitan | |
| 5,994,745 A | 11/1999 | Hong | |
| 6,011,725 A | 1/2000 | Eitan | |
| 6,028,342 A | 2/2000 | Chang | |
| 6,030,871 A | 2/2000 | Eitan | |
| 6,044,022 A | 3/2000 | Nachumovsky | |
| 6,081,456 A | 6/2000 | Dadashev | |
| 6,108,240 A | 8/2000 | Lavi | |
| 6,133,102 A | 10/2000 | Wu | |
| 6,134,156 A | 10/2000 | Eitan | |
| 6,147,904 A | 11/2000 | Liron | |
| 6,157,570 A | 12/2000 | Nachumovsky | |
| 6,160,739 A * | 12/2000 | Wong | 365/185.29 |
| 6,172,396 B1 | 1/2001 | Chang | |
| 6,172,909 B1 * | 1/2001 | Haddad et al. | 365/185.19 |
| 6,174,758 B1 | 1/2001 | Nachumovsky | |
| 6,175,523 B1 | 1/2001 | Yang | |
| 6,181,597 B1 | 1/2001 | Nachumovsky | |
| 6,184,089 B1 | 2/2001 | Chang | |
| 6,201,282 B1 | 3/2001 | Eitan | |
| 6,201,737 B1 | 3/2001 | Hollmer | |
| 6,204,529 B1 | 3/2001 | Lung | |
| 6,207,504 B1 | 3/2001 | Hsieh | |
| 6,208,557 B1 | 3/2001 | Bergemont | |
| 6,215,702 B1 | 4/2001 | Derhacobian | |
| 6,218,695 B1 | 4/2001 | Nachumovsky | |
| 6,222,768 B1 | 4/2001 | Hollmer | |
| 6,240,020 B1 | 5/2001 | Yang | |
| 6,243,300 B1 | 6/2001 | Sunkavalli | |
| 6,251,731 B1 | 6/2001 | Wu | |
| 6,255,166 B1 | 7/2001 | Ogura | |
| 6,256,231 B1 | 7/2001 | Lavi | |
| 6,266,281 B1 | 7/2001 | Derhacobian | |
| 6,269,023 B1 | 7/2001 | Derhacobian | |
| 6,272,043 B1 | 8/2001 | Hollmer | |
| 6,275,414 B1 | 8/2001 | Randolph | |
| 6,282,118 B1 | 8/2001 | Lung | |
| 6,291,854 B1 | 9/2001 | Peng | |
| 6,297,096 B1 | 10/2001 | Boaz | |
| 6,303,436 B1 | 10/2001 | Sung | |
| 6,327,174 B1 | 12/2001 | Jung | |
| 6,330,192 B1 * | 12/2001 | Ohba et al. | 365/185.3 |
| 6,348,711 B1 | 2/2002 | Eitan | |
| 6,381,177 B1 * | 4/2002 | De Sandre et al. | 365/185.19 |
| 6,381,179 B1 | 4/2002 | Derhacobian | |
| 6,392,930 B1 | 5/2002 | Jung | |
| 6,417,053 B1 | 7/2002 | Kuo | |
| 6,421,275 B1 | 7/2002 | Chen | |
| 6,429,063 B1 | 8/2002 | Eitan | |
| 6,432,778 B1 | 8/2002 | Lai | |
| 6,461,949 B1 | 10/2002 | Chang | |
| 6,468,864 B1 | 10/2002 | Sung | |
| 6,469,342 B1 | 10/2002 | Kuo | |
| 6,477,084 B1 | 11/2002 | Eitan | |
| 6,486,028 B1 | 11/2002 | Chang | |
| 6,487,050 B1 | 11/2002 | Liu | |
| 6,496,417 B1 * | 12/2002 | Shiau et al. | 365/185.2 |
| 6,498,377 B1 | 12/2002 | Lin | |
| 6,498,752 B1 * | 12/2002 | Hsu et al. | 365/185.22 |
| 6,514,831 B1 | 2/2003 | Liu | |
| 6,531,887 B1 | 3/2003 | Sun | |
| 6,545,309 B1 | 4/2003 | Kuo | |
| 6,552,287 B1 | 4/2003 | Eitan | |
| 6,552,387 B1 | 4/2003 | Eitan | |
| 6,559,013 B1 | 5/2003 | Pan | |
| 6,576,511 B1 | 6/2003 | Pan | |
| 6,580,135 B1 | 6/2003 | Chen | |
| 6,580,630 B1 | 6/2003 | Liu | |
| 6,602,805 B1 | 8/2003 | Chang | |
| 6,607,957 B1 | 8/2003 | Fan | |
| 6,610,586 B1 | 8/2003 | Liu | |
| 6,613,632 B1 | 9/2003 | Liu | |
| 6,617,204 B1 | 9/2003 | Sung | |
| 6,873,550 B1 * | 3/2005 | Mihnea | 365/185.19 |
| 6,885,060 B1 * | 4/2005 | Nomoto et al. | 257/324 |
| 2001/0001075 A1 | 5/2001 | Ngo | |
| 2001/0004332 A1 | 6/2001 | Eitan | |
| 2001/0011755 A1 | 8/2001 | Tasaka | |
| 2001/0048612 A1 | 12/2001 | Yi | |
| 2002/0000606 A1 | 1/2002 | Eitan | |
| 2002/0142569 A1 | 10/2002 | Chang | |
| 2002/0146885 A1 | 10/2002 | Chen | |
| 2002/0151138 A1 | 10/2002 | Liu | |
| 2002/0177275 A1 | 11/2002 | Liu | |
| 2002/0182829 A1 | 12/2002 | Chen | |
| 2002/0190385 A1 | 12/2002 | Chen | |
| 2003/0057997 A1 | 3/2003 | Sun | |
| 2003/0067807 A1 | 4/2003 | Lin | |
| 2003/0072192 A1 | 4/2003 | Bloom | |
| 2003/0076710 A1 * | 4/2003 | Sofer et al. | 365/185.22 |
| 2003/0117861 A1 | 6/2003 | Maayan | |
| 2003/0134473 A1 | 7/2003 | Sung | |
| 2003/0235100 A1 | 12/2003 | Pascucci | |
| 2004/0102026 A1 * | 5/2004 | Wong et al. | 438/527 |
| 2004/0185619 A1 * | 9/2004 | Chung | 438/257 |

FOREIGN PATENT DOCUMENTS

| | | |
|---|---|---|
| EP | 90115805.5 | 2/1991 |
| EP | 01113179.4 | 12/2002 |

OTHER PUBLICATIONS

B. Eitan et al., "Spatial Characterization of Hot Carriers Injected into the Gate Dielectric Stack of a MOFSET Based on Non-Volatile Memory Device," date unknown, pp. 58-60.

B. Eitan et al., "NROM: A Novel Localized Trapping, 2-Bit Nonvolatile Memory Cell," IEEE Electron Device Lett, vol. 21, No. 11, (Nov. 2000), pp. 543-545, Copyright 2000 IEEE.

E. Maayan et al., "A 512Mb NROM Flash Data Storage Memory with 8MB/s Data Range," Dig. IEEE Int. Solid-State Circuits Conf., San Francisco, (Feb. 2002), pp. 1-8, Copyright Saifun Semiconductors Ltd. 2002.

E. Maayan et al., "A 512Mb NROM Flash Data Storage Memory with 8MB/s Data Range," ISSCC 2002 Visuals Supplement, Session 6, SRAM and Non-Volatile Memories, 6.1 and 6.2, pp. 76-77, 407-408. Copyright 1990 IEEE.

M. Janai, "Data Retention, Endurance and Acceleration Factors of NROM Devices," IEEE 41st Annual International Reliability Physics Symposium, Dallas, TX (2003), pp. 502-505, Copyright 1989 IEEE.

S. Minami and Y. Kamigaki, "A Novel MONOS Nonvolatile Memory Device Ensuring 10-Year Data Retention after $10^7$ Erase/Write Cycles," IEEE Transactions on Electron Devices, vol. 40, No. 11 (Nov. 1993) pp. 2011-2017, Copyright 1998 IEEE.

C. Pan, K. Wu, P. Freiberger, A. Chatterjee, G. Sery, "A Scaling Methodology for Oxide-Nitride-Oxide Interpoly Dielectric for EPROM Applications," IEEE Transactions on Electron Devices, vol. 37, No. 6, (Jun. 1990), pp. 1439-1443, Copyright 1990 IEEE.

P. Manos and C. Hart, "A Self-Aligned EPROM Structure with Superior Data Retention," IEEE Electron Device Letters, vol. 11, No. 7, (Jul. 1990) pp. 309-311, Copyright 1990 IEEE.

W. Owen and W. Tchon, "$E^2$PROM Product Issues and Technology Trends," IEEE 1989, pp. 17-19, Copyright 1989 IEEE.

T. Huang, F. Jong, T. Chao, H. Lin, L. Leu, K. Young, C. Lin, K. Chiu, "Improving Radiation Hardness of EEPROM/Flash Cell BY N$_2$0 Annealing," IEEE Electron Device Letters, vol. 19, No. 7 (Jul. 1998), pp. 256-258, Copyright 1998 IEEE.

B. Eitan et al., "Electrons Retention Model for Localized Charge in Oxide -Nitride-Oxide (ONO) Dielectric," IEEE Device Lett., vol. 23, No. 9, (Sep. 2002), pp. 556-558. Copyright 2002 IEEE.

T. Nozaki, T. Tanaka, Y. Kijiya, E. Kinoshita, T. Tsuchiya, Y. Hayashi, "A 1-Mb EEPROM with MONOS Memory Cell for Semiconductor Disk Application," IEEE Journal of Solid-State Circuits, vol. 26, No. 4 (Apr. 1991), pp. 497-501, Copyright 1991 IEEE.

F. Vollebregt, R. Cuppens, F. Druyts, G. Lemmen, F. Verberne, J. Solo, "A New E(E)PROM Technology With A TiSi$_2$ Control Gate," IEEE 1989, pp. 25.8.1-25.8.4, Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939-1946, Copyright 2002 IEEE.

B. Eitan et al., "Spatial characterization of Channel hot electron injection utilizing subthreshold slope of the localized charge storage NROM™ memory device," Non-Volatile Semiconductor Memory Workshop (NVSMW), Monterey, CA, (Aug. 2001), pp. 1-2.

B. Eitan et al., "Can NROM, a 2-bit, Trapping Storage NVM Cell, Give a Real Challenge to Floating Gate Cells?" Int. Conf. on Solid State Devices and Materials, Tokyo, (1999), pp. 1-3, Copyright 1999 Saifun Semiconductors Ltd.

S. Ogura, et al. "Twin MONOS Cell with Dual Control Gates," Halo LSI and New Halo, pp. 187-187.3, Date Unknown.

T. Sugizaki, et al. "New 2-bit/Tr MONOS Type Flash Memory using Al$_2$O$_3$ as Charge Trapping Layer," Fujitsu Laboratories Ltd, Date Unknown.

T. Saito, et al. "Hot Hole Erase Characteristics and Reliability in Twin MONOS Device" Halo LSI, Date Unknown.

Saifun Semiconductors, LTD. PowerPoint Presentation, Date Unknown.

Y. Roizin, et al. "Novel Techniques for data retention and Leff measurements in two bit *Micro*Flash® Memory Cells," Characterization and Metrology for ULSI Technology: 200 International Conf., pp. 181-185, Copyright 2001 American Institute of Physics, 1-56396-967-X/01.

W. J. Tsai, et al. "Cause of Data Retention Loss in a Nitride-Based Localized Trapping Storage Flash Memory Cell," IEEE 40$^{th}$ Annual International Reliability Physics Symposium, Dallas, (2002), pp. 34-38. Copyright 2002 IEEE.

W.J. Tsai, et al. "Data Retention Behavior of a SONOS Type Two-Bit Storage Flash Memory Cell," IEDM 01-0179-01-722, Copyright 2001 IEEE.

A. Shappir, et al., "Subtreshold slope degradation model for localized-charge-trapping based non-volatile memory devices," Solid-State Electronics 47 (2003), pp. 937-941. Copyright 2003 Elsevier Science Ltd.

R. Neale, "AMD's MirrorBit—a big step in Flash progress," Electronic Engineering Design, V. 74, No. 906, pp. 47-50.

I. Bloom, et al., "NROM™—a new technology for non-volatile memory products" Solid-State Electronics 46 (2002), pp. 1757-1763. Copyright 2002 Elsevier Science Ltd.

J. Bu and M. White, "Electrical characterization on ONO triple dielectric in SONOS nonvolatile memory devices," Solid-State Electronics 45 (2001) pp. 47-51. Copyright 2001 Elsevier Science Ltd.

Y. Kamigaki and S. Minami, "MNOS Nonvolatile Semiconductor Memory Technology: Present and Future," IEICE Trans. Electron, vol. E84-C, No. 6, pp. 713-723 (Jun. 2001).

E. Lusky, et al., "Electron Discharge Model of Locally-Trapped Charge in Oxide-Nitride-Oxide (ONO) Gates for NROM™ Non-Volatile Semiconductor Memory Devices," Extended Abstracts of the 2001 International Conference on Solid State Devices and Materials, Tokyo, 2001 pp. 534-535.

A. Nughin, "n-Channel 256kb and 1Mb EEPROMs," ISSCC91, Session 134, Special Session on Technology in the USSR, Papers 13.4, 1991 IEEE InternationalSolid State Circuits Conference, Digest of Technical Papers, pp. 228-229, 319.

G. Xue, et al., "Low Voltage Low Cost Nitride Embedded Flash Memory Cell" IMEC., Date Unknown.

L. Breuil, et al., "A new 2 isolated-bits/cell flash memory device with self aligned split gate structure using ONO stacks for charge storage," IMEC, Date Unknown.

J. Willer, et al., "UMEM: A U-shape Non-Volatile-Memory Cell," Ingentix GmbH &Co. KG., Infineon Technologies and Saifun Semiconductors, Date Unknown.

S. Kang, et al., "A Study of SONOS Nonvolatile Memory Cell Controlled Structurally by Localizing Charge-Trapping Layer," Samsung Electrons Co., Ltd., Date Unknown.

Y. Roizin, et al., "In-Process Charging in *micro*FLASH® Memory Cells," Tower Semiconductor, Ltd., Date Unknown.

A. Shappir, et al., "Subthreshold slope degradation model for localized-charge-trapping based non-volatile memory devices," Solid State Electronics, 47 (2003) pp. 937-941, Copyright 2003 Elsevier Science Ltd.

I. Fujiwara, et al., "High speed program/erase sub 100 nm MONOS memory cell," Sony Corporation, Date Unknown.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1-2., Date Unknown.

C. C. Yeh, et al., "A Modified Read Scheme to Improve Read Disturb and Second Bit Effect in a Scaled MXVAND Flash Memory Cell," Macronix International Co., Ltd. and Department of Electronics Engineering, National Chiao-Tung University, Date Unknown.

Y. K. Lee, et al., "30-nm Twin Silicon-Oxide-Nitride-Oxide-Silicon (SONOS) Memory (TSM) with High Erase Speed and Reliability," School of Electrical Engineering, Seoul National University, C&M, System LSI, ATD, PD, Samsung Electronics Co., Date Unknown.

J. H. Kim, et al., "Highly Manufacturable SONOS Non-Volatile Memory for the Embedded SoC Solution," 2003 Symposium on VLSI Technology Digest of Technical Papers, pp. 31-32.

Y. Hayashi, et al., "Twin MONOS Cell with Dual Control Gates," 2000 Symposium on VLSI Technology Digest of Technical Papers, 2000 IEEE, pp. 122-123.

M. K. Cho and D. M. Kim, "High Performance SONOS Memory Cells Free of Drain Turn-On and Over-Erase: Compatibility Issue with Current Flash Technology," IEEE Electron Device Letters, vol. 21, No. 8, Aug. 2000, pp. 399-401, Copyright 2000 IEEE.

T. Y. Chan, K.K. Young and C. Hu, "A True Single-Transistor Oxide-Nitride-Oxide EEPROM Device," IEEE Electron Device Letters, vol. EDL-8, No. 3, Mar. 1987, pp. 93-95., Copyright 1987 IEEE.

I. Bloom, et al., "NROM™ NVM technology for Multi-Media Applications," Saifun Semiconductors, Ltd. Ingentix, Ltd. and Infineon Technologies, Date Unknown.

E. J. Prinz, et al., "An Embedded 90nm SONOS Flash EEPROM Utilizing Hot Electron Injection Programming and 2-Sided Hot Hole Injection Erase," Motorola Embedded Memory Center, Date Unknown.

Y. Roizin, et al., "Retention Characteristics of *micro*FLASH® Memory (Activation Energy of Traps in the ONO Stack)," Tower Semiconductor, Ltd., Date Unknown.

Y. Roizin, et al., "Activation Energy of Traps in the ONO Stack of *micro*FLASH® Memory Cells," Tower Semiconductor, Ltd., Date Unknown.

Y. Roizin, et al., "Dummy Gox for Optimization of *micro*FLASH® Technology," Tower Semiconductor, Ltd., Date Unknown.

Y. K. Lee, et al., "Multi-Level Vertical Channel SONOS Nonvolatile Memory on SOI," 2002 Symposium on VLSI Technology Digest of Technical Papers, Copyright 2002 IEEE.

T. Saito, et al., "CHE Program Behavior in MONOS Device," Halo LSI., Date Unknown.

J. Bu, et al., "Retention Reliability Enhanced SONOS NVSM with Scaled Programming Voltage," Microelectronics Lab., Date Unknown.

H. Tomiye, et al., "A novel 2-bit/cell MONOS memory device with a wrapped-control-gate structure that applies source-side hot-electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147-148.

* cited by examiner

METHOD FOR ERASING AN NROM CELL

TECHNICAL FIELD OF THE INVENTION

The present invention relates generally to memory devices and in particular the present invention relates to erasing nitride read only memory cells.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

There are several different types of memory such as random access memory (RAM) and read only memory (ROM). RAM is typically used as main memory in a computer environment. One can repeatedly read data from and write data into RAM. Most RAM is volatile, which means that it requires a steady flow of electricity to maintain its contents. When the power is turned off, the data in RAM is lost.

This is in contrast to ROM that generally only permits the user to read data already stored in the ROM but the ROM retains data after power is removed (i.e., non-volatile). Computers almost always contain a small amount of ROM that holds instructions for starting up the computer. Unlike RAM, ROM generally cannot be written to in routine operation.

Another type of non-volatile memory is flash memory. A flash memory is a type of EEPROM that can be erased and reprogrammed in blocks instead of one byte at a time. Many modern PCs have their BIOS stored on a flash memory chip so that it can easily be updated if necessary. Flash memory is also popular in modems because it enables the modem manufacturer to support new protocols as they become standardized.

Yet another type of non-volatile memory is a nitride read only memory (NROM). NROM has some of the characteristics of flash memory but does not require the special fabrication processes of flash memory. NROM can be implemented using a standard CMOS process.

Because of NROM's compatibility with the CMOS process, a short-channel NROM memory can be embedded into other architectures, such as microcontrollers, that also use the CMOS process. One possible type of embedded memory uses short channel NROM cells with single bit/cell storage. In this type of memory, the effective bit size is larger than in standard NROM cells with double bit/cell but the voltages used for programming/erasing are all consistent with the CMOS host process. However, one problem with embedding the short-channel NROM is that the NROM cells are sensitive to over-erasure.

For the reasons stated above, and for other reasons stated below which will become apparent to those skilled in the art upon reading and understanding the present specification, there is a need in the art for a way to erase NROM arrays without being over-erased.

SUMMARY

The above-mentioned problems with erasing NROM arrays and other problems are addressed by the present invention and will be understood by reading and studying the following specification.

The various embodiments relate to erasing NROM blocks of memory that comprise a plurality of memory cells. Each cell has a gate input and two source/drain regions. The method comprises erasing the memory block and performing a recovery operation on the plurality of memory cells such that a voltage threshold for over-erased cells is increased.

In another embodiment, the method erases the memory block and then performs a verification operation on the cells. If a read operation does not produce a column current, the erase operation was successful. If the read operation produces a column current, the recovery operation is performed to increase the threshold voltage. The verification is repeated until the column current is not detected indicating that the overerased cells are recovered.

Further embodiments of the invention include methods and apparatus of varying scope.

DETAILED DESCRIPTION

Figure 1A:
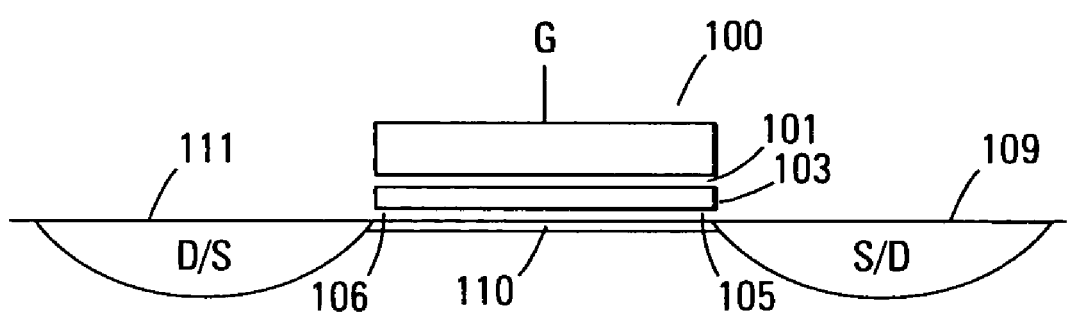
FIGS. 1A and 1B show diagrams of an NROM memory cell of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1B:
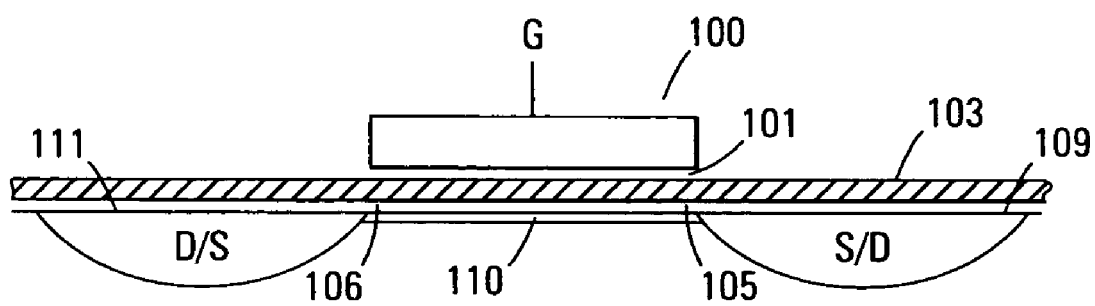

FIGS. 1A and 1B illustrate NROM memory cells of the present invention. This cell is comprised of a control gate 100 formed on top of an oxide layer 101. Below the oxide layer is a layer of nitride 103 upon which the charge is stored for the various states of the cell. In one embodiment, the cell has areas 105 and 106 for storing two bits of data on the nitride 103. The nitride layer 103 can be patterned in small pieces matching the size of each individual NROM cell (FIG. 1A) or in large sheets to uniformly cover the area of each memory array block (FIG. 1B).

Two source/drain regions 109 and 111 are at either end of the gate layer 101. The source/drain regions 109 and 111 are connected by a channel area 110 between the two regions 109 and 111. The function of each source/drain region 109 or 111 (i.e., whether source or drain) depends upon which bit area 105 or 106 is being read or written. For example, if the carrier is input at the left side source/drain region 111 and output from the right side region 109 in a read operation, the left side is the source 111 and the right side is the drain 109 and the data bit charge is stored on the nitride 103 at the source end 111.

An NROM memory block is comprised of a large number of the cells of FIG. 1. The present invention is not limited to any one quantity of NROM cells that comprise a memory block. Especially in an embedded embodiment, the quantity of cells comprising a block depends on the memory requirements of the circuitry into which the NROM cells are embedded.

Standard long-channel NROM cells for double-bit storage are inherently insensitive to over-erasure. The threshold voltage for such a cell in an erased state is kept at its "neutral" value by the mid-channel region away from either source/drain region, which has no holes trapped in the nitride dielectric above.

A newer type of short-channel NROM cells forgoes the double-bit storage in exchange for programming at a lower voltage. Such cell structure and operation are particularly well suited for embedded memory applications. These short-channel (i.e., <0.2 microns) NROM cells can inject hot holes in the mid-channel region during an erase operation and thus become sensitive to over-erasure like traditional stack-gate flash memory. The NROM cell erase methods of the present invention operate best with short channel (single-bit) architectures. However, the methods may be adapted to work with other types of NROM cell architecture.

Figure 2:
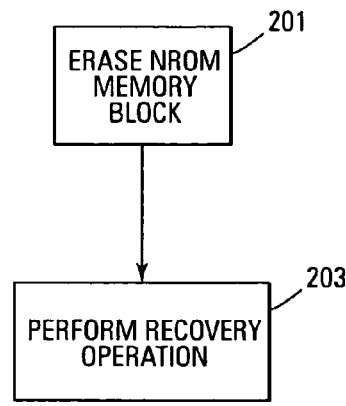
FIG. 2 shows a flow chart of a method for erasing an NROM memory cell in accordance with one embodiment of the present invention.

FIG. 2 illustrates a flow chart of a method for erasing an NROM memory array in accordance with one embodiment of the present invention. This method first erases an NROM memory block 201 as is well known in the art. This is accomplished, in one embodiment by coupling one source/drain region to a voltage in the range of 3 to 8V. The gate connection is coupled to a voltage in the range of −12 to 0V. The remaining source/drain region is coupled to a voltage in the range of 3 to 8V. In an alternate embodiment, the other source/drain connection is grounded or floating. This embodiment assumes that the voltages above are applied simultaneously to all NROM cells of a memory block for a duration long enough so that the NROM memory block is properly erased.

A high efficiency recovery operation is then performed 203. This operation raises the threshold voltage, $V_t$, for any over-erased cells. As is well known in the art, each cell has a threshold voltage that indicates when the cell is either programmed or erased. In one embodiment, cells with threshold voltages equal to or greater than a certain boundary (e.g., $V_t=4V$) are considered to be programmed while threshold voltages less than the same boundary value are considered erased. Alternate embodiments may use different states. On the other hand, when the threshold voltage of an erased cell is lower than another boundary value (e.g., $V_t=0V$), the cell is considered to be over-erased as it may induce column current when it is not selected in a read operation. The recovery step 203 is meant to raise the threshold voltage for all over-erased cells above the boundary for over-erasure (e.g., $V_t=0V$), while keeping all cells in erased state (e.g., $V_t<4V$).

In the recovery step 203, all of the cells in the memory block are biased at certain voltage ranges with the gate connection being coupled to a ramped voltage. In one embodiment, the source/drain region acting as a drain is coupled to a constant voltage in the range of 3 to 7V. The source/drain region acting as a source is coupled to a constant voltage in the range of 0 to 3V. In an alternate embodiment, this connection may be left floating. The gate connection is coupled to a ramped voltage in which the initial voltage is in the range of −3 to 0V and the final voltage is in the range of 1 to 3V. The ramp occurs in a time period of from 10 μs to 1 second.

Alternate embodiments use other voltage for the source/drain regions and other initial and final voltages for the ramped gate voltage. Additionally, the present invention is not limited to any one time period over which the ramped voltage occurs.

Figure 3:
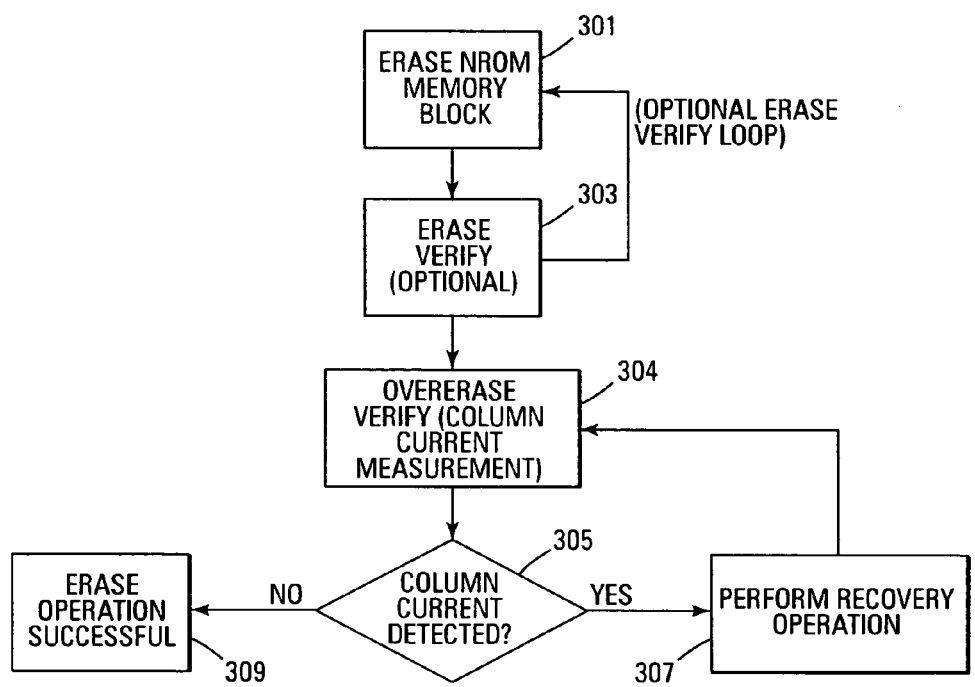
FIG. 3 shows a flow chart of a method for erasing an NROM memory cell in accordance with an alternate embodiment of the present invention.

FIG. 3 illustrates a flow chart of a method for erasing an NROM memory block in accordance with an alternate embodiment of the present invention. As in the prior embodiment, the NROM memory block is first erased 301 as is known in the art. This can be accomplished using the voltages as described above or by using other voltages.

In this embodiment, an erase verify operation can be performed 303 to verify complete erasure of the memory block. If, at this step, the block is found not completely erased, the algorithm would step back to a new erase pulse 301. When the block is found fully erased, it is subjected to an over-erase verify operation 304, which may be accomplished using a read operation and column current check. The read operation and column current check are well known in the art and not discussed further.

If a read operation is performed and column current is not detected 305, a successful erase operation has been performed 309. At this point, the erase operation is completed.

If a read operation is performed and column current is detected 305, the memory block has been over-erased and the high efficiency recovery operation 307, as described previously, is performed. The over-erase verify 304, column current detection 305, and high efficiency recovery 307 steps are then repeated until a successful erase operation has been detected by the lack of column current.

The erase operations of the present invention rely on high efficiency programming at low gate voltages attributed to secondary ionization phenomena. With the higher efficiency programming at lower cell current, more cells can be simultaneously programmed. For example, if programming takes 1 ms or less at a cell current of 100 nA or less, all cells in a memory block can be recovered from the over-erased state in a relatively short time of 10 ms or less.

Figure 4:
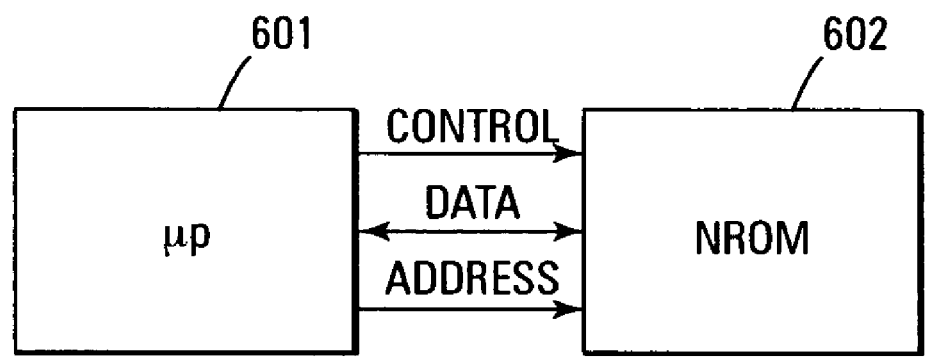
FIG. 4 shows a block diagram of one embodiment of an electronic system of the present invention having an embedded NROM array.

FIG. 4 illustrates a block diagram of an electronic system in which an NROM array is embedded. This system is comprised of a microprocessor 401 and the NROM array 402. These components 401 and 402 are incorporated onto a single integrated circuit die. Alternate embodiments may add additional components such as input/output circuitry and other types of memory.

CONCLUSION

The methods of the present invention for erasing a short-channel, NROM memory block allow stable operation for the memory block over program/erase cycling. By ramping the control gate voltage, the threshold voltage for the memory block cells is allowed to increase at a constant rate that is equal to the rate of the voltage ramp. This ensures that the cell current is constant, low, and approximately equal for all cells in the block. Additionally, the threshold voltage for all of the cells at the end of the recovery operation does not exceed the maximum voltage at the end of the ramped voltage.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for erasing a nitride read only memory (NROM) block comprising a plurality of short channel memory cells each having a channel length less than 0.2 microns, a gate input and two source/drain regions, the method comprising: erasing the memory block; and
performing a recovery operation on the plurality of memory cells such that a threshold voltage indicating a programmed state, for over-erased cells, is increased by coupling the gate input to a ramped voltage, a first source/drain region to a first constant voltage in a range of 3V to 7V, and the remaining source/drain region to a second constant voltage in a range of 0V to 3V.

2. The method of claim 1 wherein the ramped voltage starts in a range of −3 to 0V and ends in a range of 1 to 3V.

3. The method of claim 2 wherein the ramp voltage has a time period in a range of 10 microseconds to 1 second from start to end.

4. The method of claim 1 wherein the nitride read only memory cell is embedded in a CMOS device.

5. A method for erasing a nitride read only memory (NROM) block comprising a plurality of short-channel memory cells each having a channel length less than 0.2 microns, a gate input and two source/drain regions, the method comprising:
erasing the memory block; and
performing a recovery operation on the plurality of memory cells such that a threshold voltage indicating a programmed state, for over-erased cells, is increased, the recovery operation includes biasing each of the plurality of memory cells with a ramped voltage on the gate input, a constant voltage in a range of 3V to 7V on a first source/drain region and the remaining source/drain region is floating.

6. The method of claim 5 and further comprising an oxide-nitride-oxide region, between the first and second source/drain regions, that can hold a single data bit.

7. The method of claim 5 wherein the ramped voltage starts in a range of −3 to 0V and ends in a range of 1 to 3V over a time period in a range of 10 microseconds to 1 second.

8. The method of claim 5 wherein erasing the memory block includes biasing each of the plurality of cells with a first constant voltage on the gate input, a second constant voltage on a first source/drain region, and a third constant voltage on the remaining source/drain region.

9. The method of claim 8 wherein the first constant voltage is in a range of −12 to 0, the second constant voltage is in a range of 3 to 8V, and the third constant voltage is in a range of 3 to 8V.

10. The method of claim 8 wherein the first source/drain region acts as a drain connection and the remaining source/drain region acts as a source region.

11. The method of claim 10 wherein the source region is allowed to float.

* * * * *